United States Patent [19]

Yoshida et al.

[11] Patent Number: 4,540,449
[45] Date of Patent: Sep. 10, 1985

[54] ALUMINUM SUBSTRATE FOR MAGNETIC RECORDING MEDIA

[75] Inventors: Koichi Yoshida; Yoshio Hirayama; Yasuo Oka; Takashi Kajiyama; Kunihiko Hotta, all of Shizuoka, Japan

[73] Assignee: Nippon Light Metal Company Limited, Tokyo, Japan

[21] Appl. No.: 584,996

[22] Filed: Mar. 1, 1984

[30] Foreign Application Priority Data

Mar. 31, 1983 [JP] Japan .................................. 58-54009

[51] Int. Cl.³ .............................................. B21C 1/00
[52] U.S. Cl. ................... 148/31.5; 428/629; 148/6
[58] Field of Search .................. 148/31.5, 6; 428/629

[56] References Cited

U.S. PATENT DOCUMENTS 4,430,387  2/1984  Nakagawa et al. ................. 428/629

FOREIGN PATENT DOCUMENTS 1493160  11/1977  United Kingdom .

*Primary Examiner*—Veronica O'Keefe
*Attorney, Agent, or Firm*—William J. Daniel

[57] ABSTRACT

An aluminum substrate for magnetic recording media such as magnetic disks, etc., is composed of an aluminum alloy plate containing 2 to 6% by weight magnesium and impurities in only limited amounts and having on the surface an anodic oxidation film with thickness more than 3 μm formed by a chromic acid process. In the thus-anodized aluminum substrate, the occurrence of black spot defects is greatly reduced and the formation of cracks upon heating the substrate to high temperatures is prevented in spite of the thicker anodic oxidation film.

3 Claims, 1 Drawing Figure

ALUMINUM SUBSTRATE FOR MAGNETIC RECORDING MEDIA

BACKGROUND OF THE INVENTION

1. Field of the Invention

This invention relates to an aluminum substrate for making magnetic recording media, said substrate having formed thereon an anodic oxide film or layer which is hard, has high heat resistance, and has substantially no black spot defect.

2. Description of the Prior Art

Recently, ther has been much demand to increase the recording density of magnetic recording media, such as magnetic disks, etc.

For responding to such demands, it is necessary to reduce the thickness of the magnetic medium layer to be formed on a surface of the substrate and the spacing between the magnetic head and the magnetic medium.

The substrate of such magnetic recording media is required to have more excellent surface properties with respect to smoothness, and hardness.

An aluminum alloy having formed on the surface an anodic oxide film layer is used as a substrate for magnetic recording media such as magnetic disks for high recording density.

The reason why such an aluminum substrate having an anodic oxide film is used for high recording density magnetic recording media is that the anodic oxide film is hard and has high wear resistance, shows good polishability to easily provide smooth surface in high accuracy, and hence a thin magnetic layer can be easily formed on the surface thereof.

Hitherto, such an aluminum substrate used for the purpose is generally prepared by applying an anodic oxidation treatment by a sulfuric acid process to the surface of an aluminum alloy containing about 2 to 6% magnesium to easily form a hard film having good polishability but a conventional aluminum substrate finished by such a sulfuric acid anodization process has the important defects, which prevent any increase in the recording density of the magnetic recording media.

One of these defects is microscopic pit-form defects on the anodic film, which is called "black spot". The existence of this defect on the anodic film of the aluminum substrate hinders the formation of the magnetic layer on the substrate, which results in the occurrence of signal error at the use of the magnetic recording medium. Accordingly, it is desired to reduce the number of such defects on the film to as few as possible and also reduce the size of the defects to below 3 $\mu$m.

Another defect is the occurrence of cracks in the anodic oxide film formed on an aluminum substrate. In the case of obtaining a high-density magnetic recording medium, a very thin layer of $\alpha$-$Fe_2O_3$ (under 0.5 $\mu$m) is formed on the aluminum substrate by sputtering or other appropriate method and then the substrate is heated to a temperature of 300° to 400° C. to convert $\alpha$-$Fe_2O_3$ into $\gamma$-$Fe_2O_3$. In the case of performing such a high-temperature heating, the anodic oxide film on the substrate is cracked which reduces the quality of the product. For avoiding the occurrence of these cracks, it is necessary to reduce the thickness of the anodic oxide film below 3 $\mu$m. However, if the aluminum substrate having such an thin anodic film is used for magnetic disks, there occurs a problem of reducing the headcrash resistance of the magnetic disk owing to the reduction of its strength for pressure resistance.

SUMMARY OF THE INVENTION

As the result of various investigations for solving the foregoing problems on the aluminum substrate for magnetic recording media, the inventors have made the following discovery.

If intermetallic compounds such as $FeAl_3$, $MnAl_6$, $CrAl_3$, $\beta$-(Al-Fe-Si), etc., crystallize from the impurities contained in an aluminum alloy, such as iron, silicon, manganese, chromium, etc., and exist at the surface of the aluminum alloy, they lead to the formation of the microscopic pit-form defect or the black spot defect corresponding to the size of the particles of these intermetallic compounds. Therefore, for avoiding the occurrence of the black spot defects, it is necessary to reduce the number of the intermetallic compounds and also to reduce the size thereof as small as possible.

Also, when the anodic oxidation film is formed on an aluminum substrate by a chromic acid process in place of a conventional sulfuric acid process, the occurrence of the pit-form defect in the film is greatly reduced and further the anodic oxide film thus formed is not accompanied by the occurrence of cracks by the heat treatment for forming a magnetic layer.

The invention is based on the foregoing discovery.

An object of this invention is to provide an aluminum substrate for making high density magnetic recording media having formed thereon by a chromic acid anodization an anodic film layer which is excellent in wear resistivity, scratch resistivity and headcrash resistivity, and is substantially free of black spot defect and thermal cracking.

This invention is an aluminum substrate for making magnetic recording media, comprising an aluminum alloy composed of 2 to 6% by weight magnesium with the remainder being aluminum and impurities, the allowable content of said impurities being limited to 0.003% iron, 0.005% silicon, 0.25% copper, 0.5% zinc, 0.0005% manganese, 0.0005% chromium, 0.0005% nickel, and 0.0005% titanium, the total content of other impurities being 0.001%, and said aluminum alloy having on the surface an anodic film having a thickness of thicker than 3 $\mu$m formed by a chromic acid process.

DETAILED DESCRIPTION OF THE INVENTION

Figure 1:
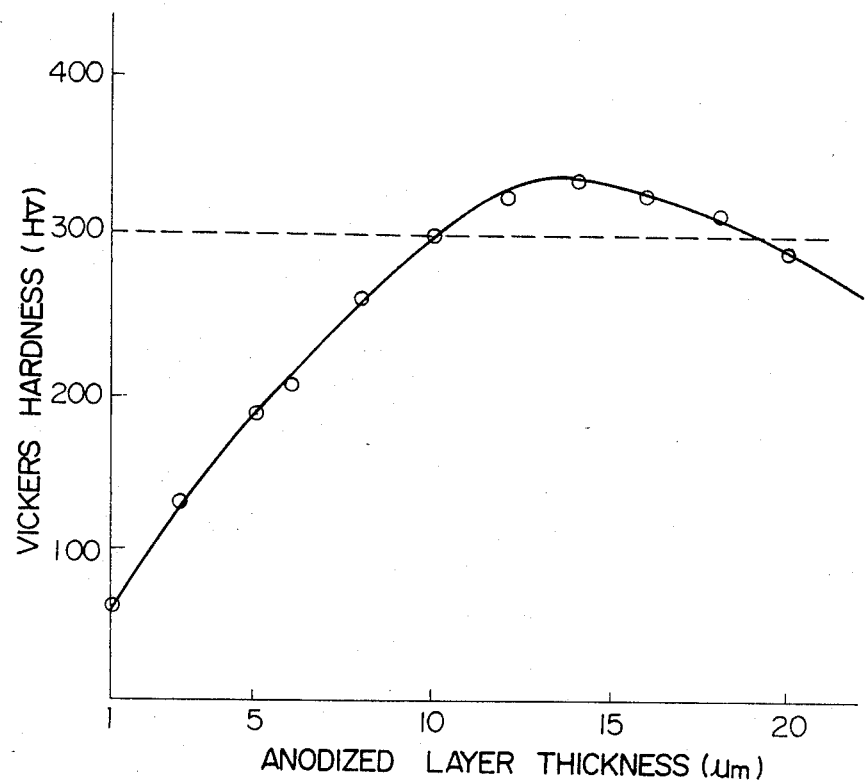
FIG. 1 is a graph showing the relation between the thickness of the anodic film and the surface hardness.

An aluminum alloy containing 2 to 6% by weight magnesium is used as the aluminum material for the aluminum substrate of this invention, since this alloy has a suitable strength for magnetic recording media such as magnetic disks, etc., and can also be easily anodically oxidized.

If the content of magnesium is less than 2% by weight, sufficient strength for a substrate is not obtained while if the content is over 6% by weight, $\beta$-$Al_2Mg_3$ is crystallized on the texture of the alloy at casting. They become coarse inclusions in the substrate made from the aluminum alloy which reduces the machinability of the substrate and easily causes the black spot defects at the formation of an anodic oxidation film.

In this invention, the allowable contents of impurities in the aluminum alloy are limited to 0.003% iron, 0.005% silicon, 0.0005% manganese, 0.0005% chromium, 0.0005% nickel, and 0.0005% titanium, the reason being as follows. When these elements exist as impurities in aluminum metal and intermetallic compounds crystallize therefrom in the alloy in the casting process the resultant inclusions are liable to become the cause of black spot defects in the anodic oxidation film on the aluminum alloy. When these impurities exist within allowable limit, the number of the intermetallic compounds formed in the alloy is greatly reduced and also the grain size of the intermetallic compounds formed is extremely fine. Accordingly, in the aluminum substrate having an anodic oxidation film formed on the surface thereof by a chromic acid process, pit-form black spot defects larger than 3 μm are not formed on the aluminum substrate and the number of the defect formed is too small to influence the quality of the sound magnetic layer.

The existence of elements having a large solid solubility limit, such as copper and zinc in the aluminum alloy at a relatively large contents does not cause serious problems to substrate and the contents of 0.25% copper and 0.5% zinc are allowable as upper limit.

The aluminum substrate of this invention is prepared by applying a precision grinding finish to the surface of the aluminum alloy by means of a diamond turning etc., to form a mirror-like surface and then applying thereto a d.c. electrolysis using a chromic acid electrolytic bath to form an anodic oxidation film.

The anodic oxidation treatment may be performed by a Bengough-Stuart process which is performed in an ordinary chromic acid process but for obtaining a better anodic film having a sufficient thickness, it is preferred to employ a constant voltage process and a treatment at a voltage, e.g., 60 to 100 volts, preferably 70 to 90 volts, higher than a generally employed voltage, at about 35° to 40° C. gives better results.

Then, the invention will be further explained by the following examples.

EXAMPLE 1

TABLE 1

| | Chemical composition (weight %)* | | | | | | | |
|---|---|---|---|---|---|---|---|---|
| | Mg | Fe | Si | Cu | Zn | Mn | Cr | Ni | Ni |
| A | 3.45 | 0.002 | 0.003 | 0.001 | 0.004 | 0.0003 | 0.0001 | 0.0002 | 0.0001 |
| B | 3.65 | 0.01 | 0.02 | 0.01 | 0.01 | 0.001 | 0.003 | 0.001 | 0.001 |

*Remainder being Al and other impurities (≦0.001)

After filtering the melt of each of two kinds of aluminum-magnesium alloys having composition A (the alloy of this invention) and composition B (a comparison alloy) shown in Table 1 by means of a ceramic filter to remove non-metallic inclusions, an ingot of each alloy having a sectional area of 255 mm × 910 mm was cast by a water cooling-type semicontinuous casting method. The ingot was heated to 480° C. for 8 hours to apply thereto a homogenizing treatment, hot rolled to a thickness of 8 mm, cold rolled to a thickness of 2 mm, and then subjected to finish annealing at 380° C. for 4 hours to provide each aluminum alloy sheet for a substrate.

Then, after lathing each of two kinds of the foregoing aluminum alloy sheets, each sheet was subjected to precision grinding by means of a diamond wheel, and after further polishing to finish a mirror face, an anodic oxidation film was formed on each alloy plate by a chromic acid process.

Also, for comparison purposes, the sheet of the alloy having composition A was subjected to an anodic oxidation treatment by a conventional sulfuric acid process (sample A').

The thickness of the anodic oxidation film formed on each base plate was 6 μm.

The electrolytic conditions employed in the above treatments were as follows.
Electrolytic condition for the chromic acid process:
Chromic acid concentration: 5 wt. %
Voltage (constant voltage process): 75 volts
Bath temperature: 40° C.
Current density: 0.3 amp./dm²
Electrolytic condition for the sulfuric acid process:
Sulfuric acid concentration: 15 wt. %
Voltage: 15 volts
Bath temperature: 20° C.
Current density: 1.5 amp./dm²

For each of the aluminum substrates this obtained, the size and the number of black spot defects in a microscopic visual range (0.355 mm²) were measured by means of an image analyzing apparatus (luzex-500) and the results are shown in Table 2.

TABLE 2

| | Formation no. of black spots per each diameter | | | | | |
|---|---|---|---|---|---|---|
| Sample | <1.0 μm | 1.0–2.0 μm | 2.0–3.0 μm | 3.0–4.0 μm | 4.0–5.0 μm | Total |
| A | 7 | 1 | 0 | 0 | 0 | 8 |
| B | 64 | 96 | 16 | 5 | 5 | 181 |
| A' | 800 | 625 | 87 | 23 | 2 | 1427 |

From the results shown in Table 2, the conclusions apply. In the aluminum substrate (sample A) of this invention, i.e., the aluminum alloy substrate containing 2–6% magnesium and impurities less than the definite allowable limit and having the anodic oxide film on the surface formed by the chromic acid process, the number of black spots is very small as compared to the substrate (sample B) having composition B containing impurities more than the definite allowable limit and having an anodic oxide film on the surface formed by the chromic acid process under the same conditions. In addition to the above no black spot larger than 2 μm, which gives far worse influences on the formation of magnetic layer is formed on the aluminum alloy substrate of this invention.

In the aluminum substrate (sample A') prepared by forming an anodic oxide film on the surface of the alloy sheet having the same composition as that of this invention by a conventional sulfuric acid process, the number of black spot defects reaches 60 times that of the aluminum substrate of this invention and also a large number of the black spots larger than 2 μm, which give bad influences on the formation of the magnetic layer are formed.

Thus, these results show the superiority of the aluminum substrate of this invention as a substrate for high recording density magnetic recording media.

Also, aluminum substrate (sample A) prepared by forming anodic oxidation films of 3 μm, 6 μm, 12 μm, and 18 μm, respectively on the aluminum sheets having composition A in Table 1 by the chromic acid process and also aluminum substrate (Sample A') prepared by forming anodic oxidation films having the same thicknesses as above on the aluminum alloy sheet having the same composition by the conventional sulfuric acid process were maintained at 300° C., and 400° C., respectively for 2 hours in each case and the formation of cracks were observed by microscopy on all substrates.

The results are shown in Table 3, wherein o, Δ and x signify no cracking, partial cracking, and overall cracking respectively.

TABLE 3

| Film thickness | Sample | Heat treatment temperature (°C.) | | |
|---|---|---|---|---|
| | | 300 | 350 | 400 |
| 3 μm | A | o | o | o |
| | A' | o | Δ | x |
| 6 μm | A | o | o | o |
| | A' | x | x | x |
| 12 μm | A | o | o | o |
| | A' | x | x | x |
| 18 μm | A | o | o | Δ |
| | A' | x | x | x |

From the results in Table 3, the following conclusive can be drawn. The aluminum substrate of this invention, i.e., the aluminum substrate prepared by forming anodic oxide films of thicker than 3 μm on the surface of the aluminum-magnesium alloy sheets containing impurities in an amount less than the definite allowable limit form no cracks by the heat treatments of the temperature range of 300° C. to 400° C. required for forming a magnetic layer. On the other hand, in the aluminum substrate prepared by forming anodic oxidation films by the conventional sulfuric acid process, the thickness of the film must be reduced below 3 μm for preventing the occurrence of cracks.

EXAMPLE 2

TABLE 4

| Sample | Composition (Wt %) | | | | | | | | |
|---|---|---|---|---|---|---|---|---|---|
| | Si | Fe | Cu | Mu | Mg | Zn | Cr | Ti | Ni |
| A-1 | 0.004 | 0.003 | 0.0001 | 0.0002 | 3.50 | 0.0005 | 0.0001 | 0.0001 | 0.0001 |
| A-2 | 0.003 | 0.003 | 0.001 | 0.0003 | 3.50 | 0.35 | 0.0003 | 0.0001 | 0.0001 |
| A-3 | 0.004 | 0.002 | 0.10 | 0.0003 | 3.48 | 0.10 | 0.0004 | 0.0001 | 0.0002 |
| A-4 | 0.003 | 0.002 | 0.0001 | 0.0004 | 4.50 | 0.01 | 0.0001 | 0.0001 | 0.0001 |
| A-5 | 0.004 | 0.002 | 0.001 | 0.0003 | 4.45 | 0.40 | 0.0003 | 0.0002 | 0.0002 |
| A'-6 | 0.004 | 0.002 | 0.01 | 0.0004 | 4.50 | 0.25 | 0.0001 | 0.0001 | 0.0003 |
| B-7 | 0.004 | 0.008 | 0.0001 | 0.0003 | 3.20 | 0.0005 | 0.0002 | 0.0001 | 0.0001 |
| B-8 | 0.05 | 0.01 | 0.05 | 0.0004 | 3.25 | 0.0005 | 0.0002 | 0.0001 | 0.0001 |
| B-9 | 0.003 | 0.01 | 0.0001 | 0.02 | 3.68 | 0.01 | 0.01 | 0.03 | 0.0001 |
| B-10 | 0.003 | 0.002 | 0.10 | 0.0003 | 5.30 | 0.10 | 0.001 | 0.02 | 0.05 |

The aluminum sheets having composition A (6 kinds) and composition B (4 kinds, comparison alloys) shown in Table 4 obtained by the same conditions as in Example 1 were subjected to the anodic oxidation treatment by the chromic acid process as in Example 1 to form the aluminum substrate (samples A-1 to A-5 of this invention and comparison samples B-7 to B-10, sample A'-6 only was prepared by forming the anodic oxidation film on the aluminum sheet having composition A shown in Table 4 by the conventional sulfuric acid process) and the mechanical properties, the formation of the black spots, and the formation of cracks after maintaining these samples at 350° C. for 2 hours were examined, the results being shown in Table 5. In this case, the thickness of the film was 12 μm and the examination of the black spots and the cracks was carried out in the microscopic visual range of microscope (0.355 mm²).

TABLE 5

| Sample | Mechanical properties | | | Black spots | | Formation of cracks (350° C.) |
|---|---|---|---|---|---|---|
| | σ B (kg/mm) | σ 0.2 (kg/mm) | δ (%) | <3.0 μm | >3.0 μm | |
| A-1 | 22.5 | 9.5 | 25 | 34 | 0 | No |
| A-2 | 23.1 | 10.3 | 25 | 18 | 0 | " |
| A-3 | 23.3 | 10.0 | 25 | 26 | 0 | " |
| A-4 | 27.0 | 12.0 | 27 | 23 | 0 | " |
| A-5 | 27.3 | 12.5 | 27 | 20 | 0 | " |
| A'-6 | 27.0 | 12.0 | 27 | 1360 | 28 | Yes |
| B-7 | 22.0 | 9.0 | 25 | 93 | 14 | No |
| B-8 | 22.5 | 9.3 | 25 | 101 | 2 | " |
| B-9 | 22.5 | 9.8 | 25 | 128 | 42 | " |
| B-10 | 28.0 | 13.0 | 27 | 72 | 13 | " |

From the results of Table 5, the following conclusions can be drawn. In the aluminum substrates (A-1 to a-5) of this invention prepared by forming the anodic oxidation film on the surface of the aluminum alloy plates having the alloy composition of this invention by the chromic acid anodization process, the formation of black spots is less and no cracks are formed. On the other hand, in the aluminum base plate (A'-6) prepared by forming the anodic oxidation film on the aluminum alloy plate having the alloy composition of this invention by the conventional sulfuric acid anodization process and the comparison aluminum substrates (B-7 to B-10) prepared by forming the anodic oxidation film on the aluminum alloy plates having the other compositions than those of this invention by the chromic acid process, a larger number of black spots, in particular black spots having a size larger than 3 μm appear in the films and in particular, in the base plate (A'-6) having the anodic oxidation film by the conventional sulfuric acid process, cracks which are fatal defects in a substrate for magnetic recording media form upon heat treatment.

EXAMPLE 3

On the aluminum alloy plates having composition A shown in Table 1 of Example 1 were anodized various thicknesses by the anodix oxidation treatment of the chromic acid process as in Example 1. Then, the surfaces of each film on the sheets were polished on use of cerium oxide grinding medium to finish to the surface roughness ($R_{max}$) of 0.02 μm and the surface hardness was measured by means of a Vickers micro-hardness test metal (load 15 g).

FIG. 1 of the accompanied drawing is a curve showing the relation between the thickness of the anodic film on the aluminum substrate of this invention and the surface hardness.

As is understood from FIG. 1, the surface hardness of the aluminum substrate of this invention becomes higher than 300 Hv in Vickers hardness at the point that the thickness of the anodic oxidation film formed goes over 10 μm, reaches the maximum between 13 μm and 16 μm in thickness, and then decreases below 300 Hv above 20 μm in thickness.

Accordingly, when the aluminum substrate is used for magnetic disks, etc., the aluminum substrate having the anodic oxidation film having a thickness of about 10 μm to 20 μm, preferably 12 μm to 18 μm from the view points of abrasion resistance and scratch resistance.

In particular, the aluminum substrate having an anodic oxidation film of about 10 to 20 μm has a very high hardness satisfying both the abrasion resistance and scratch resistance and has very excellent properties as the aluminum substrate for high recording density magnetic recording media.

As stated above, in the aluminum substrate of this invention, there is no formation of black spot defects and also in spite of the increased thickness of the anodic oxidation film above 3 μm, no cracks form by the heat treatment at a temperature higher than 300° C., which is necessary for the formation of a magnetic medium layer. Therefore, the aluminum substrate of this invention is quite suitable for magnetic recording media such as magnetic disks, optomagnetic disks, etc.

What is claimed is:

1. An aluminum substrate for magnetic recording media comprising an aluminum alloy plate composed of 2 to 6% by weight magnesium, the remainder being aluminum and impurities, the limits of the allowable contents of said impurities being 0.003% iron, 0.005% silicon, 0.25% copper, 0.5% zinc, 0.0005% manganese, 0.0005% chromium, 0.0005% nickel, and 0.0005% titanium and for the total amount of other impurities 0.001%, said aluminum base plate having on the surface thereof an anodic oxidation film having a thickness more than 3 μm formed by a chromic acid anodization process.

2. The aluminum substrate for magnetic recording media as claimed in claim 1, wherein the anodic oxidation film formed by the chromic acid anodization process has a thickness of 10 μm to 20 μm.

3. The aluminum substrate for magnetic recording media as claimed in claim 1, wherein the anodic oxidation film is formed on the aluminum alloy plate after applying a precise grinding finish to the surface of the alloy plate.

* * * * *